United States Patent
Du et al.

(10) Patent No.: US 12,058,499 B2
(45) Date of Patent: Aug. 6, 2024

(54) AUDIO PROCESSING METHOD AND DEVICE, TERMINAL, AND COMPUTER-READABLE STORAGE MEDIUM

(71) Applicant: Tencent Music Entertainment Technology (Shenzhen) Co., Ltd., Guangdong (CN)

(72) Inventors: Chengcai Du, Guangdong (CN); Zhenhai Yan, Guangdong (CN)

(73) Assignee: Tencent Music Entertainment Technology (Shenzhen) Co., Ltd., Guangdong (CN)

( * ) Notice: Subject to any disclaimer, the term of this patent is extended or adjusted under 35 U.S.C. 154(b) by 226 days.

(21) Appl. No.: 17/629,357

(22) PCT Filed: Oct. 28, 2019

(86) PCT No.: PCT/CN2019/113685
§ 371 (c)(1),
(2) Date: Jan. 21, 2022

(87) PCT Pub. No.: WO2020/238000
PCT Pub. Date: Dec. 3, 2020

(65) Prior Publication Data
US 2022/0345817 A1 Oct. 27, 2022

(30) Foreign Application Priority Data
May 24, 2019 (CN) .......................... 201910439413.2

(51) Int. Cl.
*H04R 3/04* (2006.01)
*G10L 19/26* (2013.01)

(52) U.S. Cl.
CPC ................ *H04R 3/04* (2013.01); *G10L 19/26* (2013.01)

(58) Field of Classification Search
CPC .................................. H04R 3/04; G10L 19/26
(Continued)

(56) References Cited

U.S. PATENT DOCUMENTS

| 4,773,094 A | * | 9/1988 | Dolby | .................... G11B 27/36 381/98 |
| 8,090,120 B2 | | 1/2012 | Seefeldt | |

(Continued)

FOREIGN PATENT DOCUMENTS

| CN | 1971711 A | 5/2007 |
| CN | 103987001 A | 8/2014 |

(Continued)

OTHER PUBLICATIONS

CNIPA, International Search Report (with English translation) for International Patent Application No. PCT/CN2019/113685, Feb. 26, 2020, 5 pages.

(Continued)

*Primary Examiner* — Daniel R Sellers
(74) *Attorney, Agent, or Firm* — IP Spring

(57) ABSTRACT

Implementation of the disclosure provides an audio processing method, a device, a terminal and a computer-readable storage medium. The method can include the following. An audio to-be-matched and a reference audio are obtained. A frequency spectrum distribution of the audio to-be-matched and a frequency spectrum distribution of the reference audio are obtained. A target filter set for matching the audio to-be-matched with the reference audio is determined according to the frequency spectrum distribution of the audio to-be-matched and the frequency spectrum distribution of the reference audio. The target filter set is determined as a matching rule for the audio to-be-matched and the reference audio. An audio playing device is compensated by using the matching rule to adjust an audio playing effect of the audio playing device; and an audio is played through the compensated audio playing device.

20 Claims, 4 Drawing Sheets

(58) Field of Classification Search
USPC .................................. 381/98, 101, 103, 107
See application file for complete search history.

(56) References Cited

U.S. PATENT DOCUMENTS

| | | | |
|---|---|---|---|
| 2006/0140418 A1 | 6/2006 | Koh et al. | |
| 2007/0025566 A1* | 2/2007 | Reams | H04R 3/002 381/98 |
| 2007/0291959 A1* | 12/2007 | Seefeldt | H03G 9/025 381/104 |
| 2010/0067709 A1* | 3/2010 | Seefeldt | G10L 25/69 381/56 |
| 2010/0166222 A1* | 7/2010 | Bongiovi | H04S 1/007 381/103 |
| 2012/0239391 A1* | 9/2012 | Duwenhorst | H04R 3/00 704/E19.001 |
| 2015/0243271 A1 | 8/2015 | Goldstein | |
| 2016/0036404 A1 | 2/2016 | Fleischmann et al. | |

FOREIGN PATENT DOCUMENTS

| | | |
|---|---|---|
| CN | 104661153 A | 5/2015 |
| CN | 104811155 A | 7/2015 |
| CN | 105792072 A | 7/2016 |
| CN | 106601268 A | 4/2017 |
| CN | 109658942 A | 4/2019 |
| CN | 110191396 A | 8/2019 |
| JP | 2005055778 A | 3/2005 |

OTHER PUBLICATIONS

CNIPA, First Office Action for Chinese Patent Application No. CN201910439413.2, Mar. 2, 2020, 9 pages.
CNIPA, Second Office Action for Chinese Patent Application No. CN201910439413.2, Nov. 13, 2020, 7 pages.
Zheng, Jiachun et al., "Digital Signal Processing-Based on Numerical Calculation," Xidian University Press, Mar. 2013, pp. 256-257.
CNIPA, Written Opinion (with English translation) for International Patent Application No. PCT/CN2019/113685, Feb. 26, 2020, 5 pages.

* cited by examiner

AUDIO PROCESSING METHOD AND DEVICE, TERMINAL, AND COMPUTER-READABLE STORAGE MEDIUM

CROSS-REFERENCE TO RELATED APPLICATIONS

This application is the U.S. National Stage filing under 35 U.S.C. § 371 of International Patent Application No. PCT/CN2019/113685, filed on Oct. 28, 2019, which in turn claims priority under PCT Article 8 and/or 35 U.S.C. § 119(a) to Chinese Patent Application No. 201910439413.2, filed on May 24, 2019, which is incorporated herein by reference in its entirety.

TECHNICAL FIELD

The disclosure relates to the field of audio processing technology, in particular to an audio processing method, an audio processing device, a terminal, and a computer-readable storage medium.

BACKGROUND

With development of science and technology, an audio playing device such as a headphone has been used more and more in people's daily lives. Generally speaking, an audio playing effect of the audio playing device can be adjusted by adjusting an equalizer. Specifically, corresponding parameters of the equalizer can be adjusted to adjust the audio playing effect of the audio playing device in response to user's adjustment operations on the equalizer. However, for the above adjustment method, it is required to listen to the audio playing effect of the audio playing device every time the equalizer is adjusted, and if the audio playing effect is not satisfied, the equalizer needs to be adjusted again. It can be seen that the existing method of adjusting the audio playing effect takes a long time and presents a low efficiency.

SUMMARY

In a first aspect, an audio processing method is provided in implementations of the present disclosure, which includes the following.

An audio to-be-matched and a reference audio are obtained. A frequency spectrum distribution of the audio to-be-matched and a frequency spectrum distribution of the reference audio are obtained. A frequency spectrum difference between the audio to-be-matched and the reference audio is determined according to the frequency spectrum distribution of the audio to-be-matched and the frequency spectrum distribution of the reference audio. A target filter set for matching the audio to-be-matched with the reference audio is determined by using the frequency spectrum difference. The target filter set is determined as the matching rule for the audio to-be-matched and the reference audio. An audio playing device is compensated by using the matching rule to adjust an audio playing effect of the audio playing device. An audio is played through the compensated audio playing device.

In a second aspect, a terminal is provided in implementations of the disclosure, which includes a processor and a memory. The processor and the memory are connected with each other, the memory is configured to store a computer program including program instructions, and the processor is configured to call the program instructions to execute the audio processing method as described in the first aspect.

In a third aspect, a non-transitory computer-readable storage medium storing a computer program is provided in implementations of the present disclosure, the computer program includes program instructions which, when executed by a processor, cause the processor to execute the audio processing method as described in the first aspect.

BRIEF DESCRIPTION OF THE DRAWINGS

In order to describe technical solutions of implementations of the present disclosure or in the related art more clearly, the following will give a brief introduction to the accompanying drawings used for describing the implementations. Apparently, the accompanying drawings hereinafter described are merely some implementations of the present disclosure or in the related art. Based on these drawings, those of ordinary skill in the art can also obtain other drawings without creative effort.

DETAILED DESCRIPTION

Technical solutions in implementations of the present disclosure will be described with reference to the drawings in the implementations of the present disclosure in the following.

In implementations of the disclosure, an audio processing method is provided, in which an audio playing effect of an audio playing device can be adjusted by obtaining a matching rule for an audio to-be-matched and a reference audio and compensating the audio playing device by using the matching rule, and an audio is played through the compensated audio playing device. The audio to-be-matched refers to a recorded audio played by a first audio playing device, and an audio playing effect of the first audio playing device is poor or nonstandard. The reference audio refers to a recorded audio played by a second audio playing device, and an audio playing effect of the second audio playing device is better or more standard.

Optionally, the first audio playing device and the second audio playing device are of a same type. The audio played by the first audio playing device and the audio played by the second audio playing device correspond to a same sound source, for example, a same segment of a same song.

Optionally, an audio playing device to-be-compensated and the first audio playing device may or may not be a same audio playing device, and the audio playing effect of the audio playing device to-be-compensated is poor or nonstandard.

Figure 1:
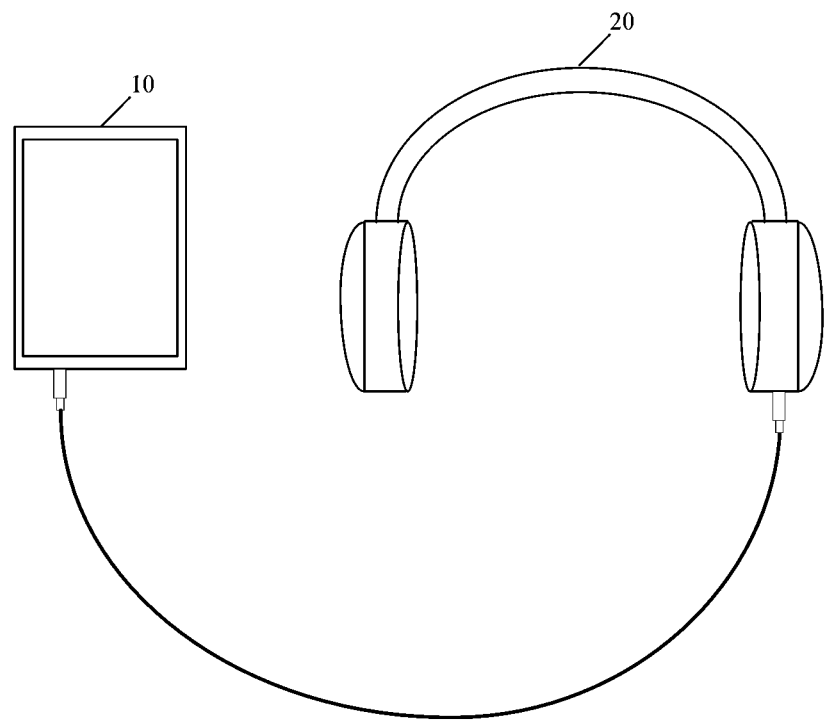
FIG. 1 is a schematic diagram of an audio processing scene provided in implementations of the present disclosure.

In an implementation, the audio processing method can be applied to a terminal to adjust an audio playing effect of a connected audio playing device. The "connected" can be a wired or a wireless one. As illustrated in FIG. 1, a smart phone 10 is illustrated, and the smart phone 10 is connected with a pair of headphones 20. With the audio processing method described in implementations of the disclosure, the smart phone is enabled to compensate the earphone 20 by using the matching rule, so that the earphone 20 can present a better audio playing effect.

Optionally, in FIG. 1, the audio processing method can also be applied to the audio playing device to adjust its own audio playing effect. With the audio processing method described in implementations of the present disclosure, the earphone 20 can be compensated itself by using the matching rule to present a better audio playing effect.

The terminal can obtain the matching rule for the audio to-be-matched and the reference audio in any of the following ways.

In an implementation, the terminal can calculate the matching rule in real time. For example, the terminal may obtain the matching rule for the audio to-be-matched and the reference audio as follows. The terminal obtains the audio to-be-matched and the reference audio; and the terminal determines the matching rule for the audio to-be-matched and the reference audio according to a frequency spectrum difference between the audio to-be-matched and the reference audio.

In an implementation, the terminal can obtain the matching rule from a server. For example, the terminal may obtain the matching rule for the audio to-be-matched and the reference audio as follows. The terminal sends a matching rule obtaining request to the server, and receives the matching rule for the audio to-be-matched and the reference audio returned by the sever according to the matching rule obtaining request. The server can also calculate the matching rule in the above described way. Optionally, the matching rule obtaining request can carry the audio to-be-matched and the reference audio, so that the server can calculate the matching rule for the audio to-be-matched and the reference audio according to the audio to-be-matched and the reference audio. Optionally, the matching rule obtaining request is configured to trigger the server to obtain the matching rule for the audio to-be-matched and the reference audio. Optionally, the matching rule obtaining request may also carry an identity of the audio playing device, so that the server can find out the matching rule for the audio to-be-matched and the reference audio corresponding to the audio playing device according to the identity of the audio playing device. This identity is a name and/or model.

In an implementation, the terminal can calculate the matching rule in advance. Specifically, the terminal can obtain the audio to-be-matched and the reference audio and determine the matching rule for the audio to-be-matched and the reference audio according to the frequency spectrum difference between the audio to-be-matched and the reference audio.

Figure 2:
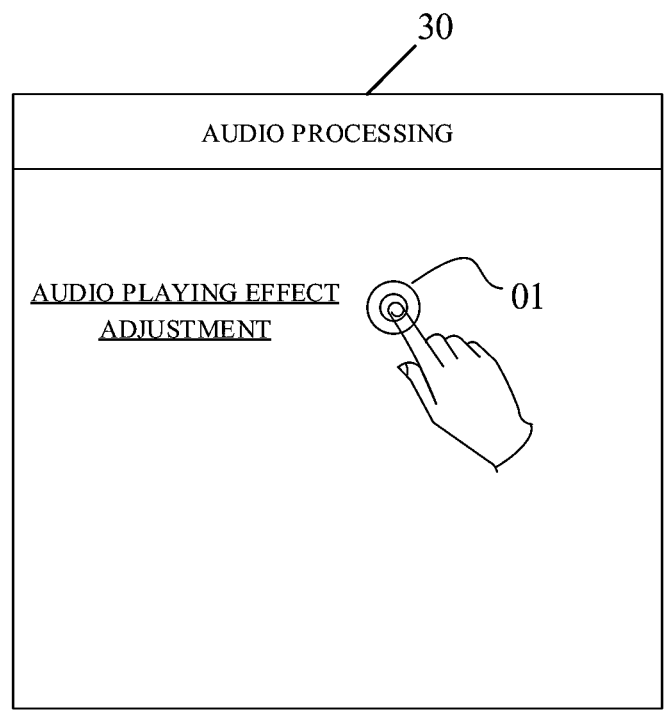
FIG. 2 is a schematic diagram of an audio processing interface provided in implementations of the present disclosure.

In an implementation, the terminal can obtain the matching rule for the audio to-be-matched and the reference audio in response to a user's adjustment operation on the audio playing effect of the audio playing device. Optionally, the adjustment operation on the audio playing effect may include a touch operation, such as a click operation, on an audio playing effect adjustment button or an audio playing device adaptation button. As illustrated in FIG. 2, an audio processing interface 30 is illustrated, and the audio processing interface 30 has an audio playing effect adjustment button 01. When the user wants to adjust the audio playing effect of the audio playing device, he/she can click the audio playing effect adjustment button 01. The terminal can execute the audio processing method described in implementations of the present disclosure in response to the click operation of the user on the audio playing effect adjustment button 01.

In an implementation, the terminal can obtain the matching rule for the audio to-be-matched and the reference audio when the audio playing device is detected to be in an audio playing state. Optionally, when the audio playing device is detected to be in the audio playing state, the terminal can obtain the matching rule for the audio to-be-matched to the reference audio in response to the user's adjustment operation on the audio playing effect of the audio playing device. Of course, the terminal can also obtain the matching rule for the audio to-be-matched and the reference audio when other preset conditions are met, which will not be listed in the implementations of the disclosure.

Figure 3:
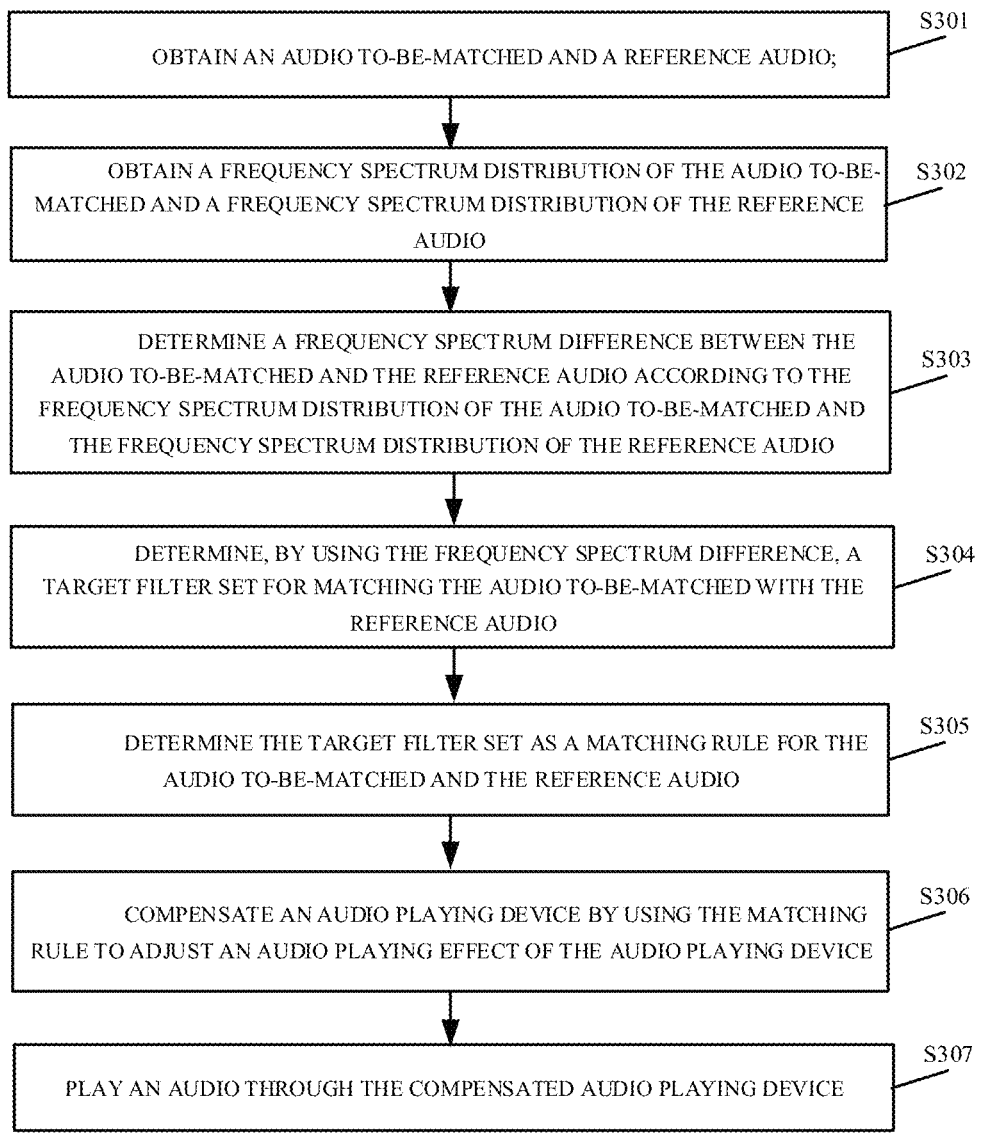
FIG. 3 is a schematic flow chart of an audio processing method provided in implementations of the present disclosure.

In an implementation, the implementations of the present disclosure provide a schematic flow chart of an audio processing method in FIG. 3. The method described in the implementation of the disclosure can be realized by a terminal, which can be a smart terminal or an audio playing device. The terminal includes, but is not limited to, a smart phone, a tablet computer, a notebook computer, a desktop computer, an MP3, an MP4 or other smart terminals. The audio playing device includes but is not limited to a headphone, such as a wired headphone, a wireless headphone such as a Bluetooth/wireless fidelity (WIFI) headphone, a wireless speaker such as a Bluetooth/WIFI speakers, or other devices that can be configured for audio playing. Further, the above headphones can be classified into ordinary headphones and high fidelity (HIFI) headphones, which are not limited in the implementations of the present disclosure. The method includes operations at S301 to S303.

At S301, an audio to-be-matched and a reference audio are obtained.

In the implementation of the disclosure, the terminal can obtain a matching rule for the audio to-be-matched and the reference audio.

Specifically, the terminal can obtain the audio to-be-matched and the reference audio and determine the matching rule for the audio to-be-matched and the reference audio according to a frequency spectrum difference between the audio to-be-matched and the reference audio.

Specifically, reference of determining, by the terminal, the matching rule for the audio to-be-matched and the reference audio according to the frequency spectrum difference between the audio to-be-matched and the reference audio, can be made to operations described at S302 to S305.

At S302, a frequency spectrum distribution of the audio to-be-matched and a frequency spectrum distribution of the reference audio are obtained.

In the implementation of the disclosure, in order to determine the matching rule for the audio to-be-matched to the reference audio, the terminal can obtain the frequency spectrum distribution of the audio to-be-matched and the frequency spectrum distribution of the reference audio.

In an implementation, the terminal can perform frequency spectrum analysis on the audio to-be-matched to obtain the frequency spectrum distribution of the audio to-be-matched, and perform frequency spectrum analysis on the reference audio to obtain the frequency spectrum distribution of the reference audio. Methods for the spectrum analysis include but are not limited to any of the following: a periodogram method, an autocorrelation method, a Bartlett method, and a Welch method. The frequency spectrum distribution refers to a frequency distribution curve, such as a frequency response curve, hereinafter referred to as a frequency-response curve. Optionally, the frequency-response curve can be an amplitude-frequency response curve. Generally speaking, an abscissa of the frequency-response curve represents points of frequency, hereinafter referred to as frequency points, and an ordinate thereof represents an amplitude value at a corresponding frequency point. In an implementation, an amplitude value in the implementation of the present disclosure can also be called an amplitude-frequency response value.

Assuming that frequency points for frequency spectrum estimation of the audio to-be-matched and frequency points for frequency spectrum estimation of the reference audio are both $f_i$ (i=1, . . . , n), n being an integer greater than or equal to 1, amplitude values at corresponding frequency points for the reference audio and the audio to-be-matched can be expressed as $g_i$ and $g_i'$ respectively.

In an implementation, the terminal can perform frequency spectrum analysis on the audio to-be-matched to obtain the frequency spectrum distribution of the audio to-be-matched, and download the frequency spectrum distribution of the reference audio from a server. The server stores the frequency spectrum distribution of the reference audio, which effectively saves storage space of the terminal.

In an implementation, the terminal can also download the frequency spectrum distribution of the audio to-be-matched and the frequency spectrum distribution of the reference audio from the server. The server stores the frequency spectrum distribution of the audio to-be-matched and the frequency spectrum distribution of the reference audio, which effectively saves the storage space of the terminal.

At S303, a frequency spectrum difference between the audio to-be-matched and the reference audio is determined according to the frequency spectrum distribution of the audio to-be-matched and the frequency spectrum distribution of the reference audio.

The frequency spectrum difference refers to a difference between the frequency spectrum distribution of the audio to-be-matched and the frequency spectrum distribution of the reference audio. In an implementation, the frequency spectrum difference refers to an error frequency-response curve between the audio to-be-matched and the reference audio, and the error frequency-response curve is obtained by performing a difference operation between the frequency spectrum distribution of the audio to-be-matched and the frequency spectrum distribution of the reference audio. For example, the error frequency-response curve between the audio to-be-matched and the reference audio is $g_i^e$, and $g_i^e$ is calculated by a following equation:

$$g_i^e = g_i' - g_i;\qquad\text{equation 1.1.}$$

In equation 1.1, the error frequency-response curve $g_i^e$ can be obtained by subtracting the amplitude value $g_i'$ of the reference audio at a corresponding frequency point from the amplitude value $g_i$ of the audio to-be-matched at the corresponding frequency point.

At S304, a target filter set for matching the audio to-be-matched with the reference audio is determined by using the frequency spectrum difference.

At S305, the target filter set is determined as the matching rule for the audio to-be-matched and the reference audio.

The target filter set may include one or more filters.

In an implementation, the target filter set for matching the audio to-be-matched with the reference audio is determined by using the frequency spectrum difference as follows. A filter parameter is determined according to the error frequency-response curve; and the target filter set for matching the audio to-be-matched with the reference audio is determined from a filter set to be selected by using the filter parameter. The filter set to be selected includes M filters, and M is a positive integer greater than or equal to 1. The filter parameter includes a cut-off frequency, a gain value, and a quality factor. The filter set to be selected includes any one or more of the following types of filter: a low-pass filter, a first type of band-pass filter, a second type of band-pass filter, and a high-pass filter. Each type of filter includes any one or more of following filters: a first order filter, a second order filter, a third order filter and, a fourth order filter. For example, the low-pass filter may include a first order low-pass filter, a second order low-pass filter, a third order low-pass filter, and a 4-th order low-pass filter.

In an implementation, the filter parameter is determined according to the error frequency-response curves as follows. A maximum amplitude value and a target frequency point on the error frequency-response curve are obtained, an amplitude value corresponding to the target frequency point being half of the maximum amplitude value, or the target frequency point being a preset frequency point; and the filter parameter is determined by using the maximum amplitude value and the target frequency point. The filter parameter includes a cut-off frequency, a gain value, and a quality factor. The target frequency point can include a low-side frequency and a high-side frequency. In an implementation, the low-side frequency described in the implementation of the present disclosure can be called a low-side cut-off frequency and the high-side frequency can be called a high-side cut-off frequency.

In an implementation, the maximum amplitude value on the error frequency-response curve refers to a maximum amplitude value of an absolute error frequency-response curve. The absolute error frequency-response curve is obtained by taking an absolute value of the amplitude value of the error frequency-response curve. For example, the error frequency-response curve is $g_i^e$, and the absolute error frequency-response curve is $g_i^{ae}$, and $g_i^{ae}$ is calculated by a following equation:

$$g_i^{ae} = |g_i^e|\qquad\text{equation 1.2}$$

In the following, taking the absolute error frequency-response curve $g_i^{ae}$ as an example, several methods of determining the target frequency points provided in the implementations of the present disclosure will be briefly explained.

First, the target frequency point can be found directly on the absolute error frequency-response curve. Specifically, a frequency point corresponding to the maximum amplitude value of the absolute error frequency-response curve $g_i^{ae}$ is found, and an index number of the frequency point is set to be m, and the maximum amplitude value of the absolute error frequency-response curve $g_i^{ae}$ is expressed as $g_m^{ae}$. From the absolute error frequency-response curve $g_i^{ae}$, a frequency point with an amplitude value $g_m^{ae}/2$ on the left and a frequency point with the amplitude value $g_m^{ae}/2$ on the right of a maximum amplitude value point of the absolute error frequency-response curve $g_i^{ae}$ are searched, and frequency points with the amplitude value $g_m^{ae}/2$ are determines as the target frequency point. Here, the low-side frequency is the frequency point with the amplitude value $g_m^{ae}/2$ on the left of the maximum amplitude value point, and the high-side frequency is the frequency point with the amplitude value $g_m^{ae}/2$ on the right of the maximum amplitude value. $g_m^{ae}/2$ refers to half of the maximum amplitude value.

Figure 4:
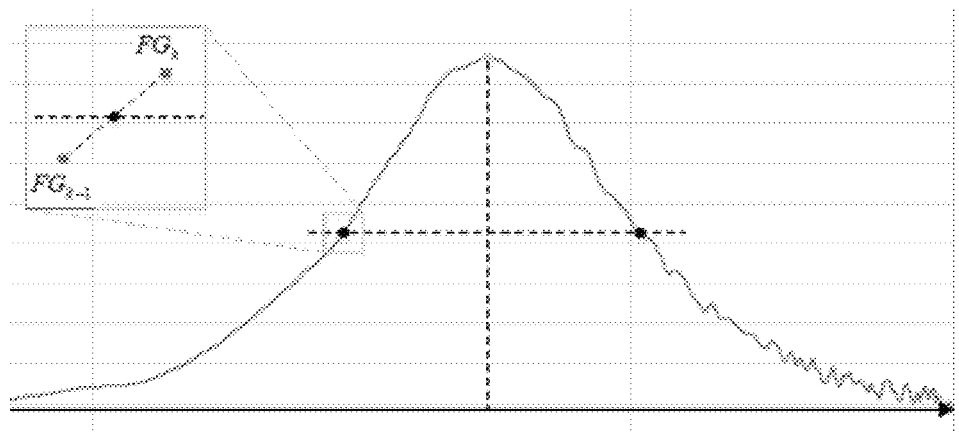
FIG. 4 is a schematic diagram of an absolute error frequency-response curve provided in implementations of the present disclosure.

Secondly, the target frequency point can be indirectly found on the absolute error frequency-response curve. Because the absolute error frequency-response curve is composed of some discrete values, there may be no way to directly find the target frequency point on the absolute error frequency-response curve $g_i^{ae}$. At this time, the target frequency point can be calculated by equation 1.3. As illustrated in FIG. 4, on the left side of the maximum amplitude point of the absolute error frequency-response curve $g_i^{ae}$, if an amplitude value corresponding to an amplitude-frequency point $FG_{k-1}$ is less than $g_m^{ae}/2$ and an amplitude value corresponding to a amplitude-frequency point $FG_k$ is greater than $g_m^{ae}/2$, a frequency point with the amplitude value $g_m^{ae}/2$ on the left of the maximum amplitude point is calculated with these two amplitude-frequency points, as the low-side frequency. Specifically, $f_l$ is calculated by a following equation:

$$f_l = f_k * (g_m^{ae}/2 - g_{k-1}^{ae}) + f_{k-1} * (g_k^{ae} - g_m^{ae}/2) \qquad \text{equation 1.3}$$

When i=k, $f_k$ represents the k-th frequency point, $f_k$ represents a frequency point corresponding to $FG_k$, and $g_k^{ae}$ represents an amplitude value corresponding to $FG_k$; $f_{k-1}$ represents the k−1-th frequency point, $f_{k-1}$ represents a frequency point corresponding to $FG_{k-1}$, and $g_{k-1}^{ae}$ is an amplitude value corresponding to $FG_{k-1}$. Accordingly, a frequency point with the amplitude value $g_m^{ae}/2$ on the right of the maximum amplitude value point of the absolute error frequency-response curve $g_i^{ae}$ is the high-side frequency $f_h$, which can also be calculated in a similar way and will not be repeatedly described in implementations of the present disclosure here.

In an implementation, $g_k^{ae}$ is an amplitude value located on the right of $g_m^{ae}/2$ and on the left of $g_m^{ae}$ and with a smallest absolute difference value from $g_m^{ae}/2$. $g_{k-1}^{ae}$ is an amplitude value located on the left of $g_m^{ae}/2$ and with a smallest absolute difference value from $g_m^{ae}/2$. $g_k^{ae}$ and $g_{k-1}^{ae}$ are adjacent amplitude values on the absolute error frequency-response curve $g_i^{ae}$.

Figure 5:
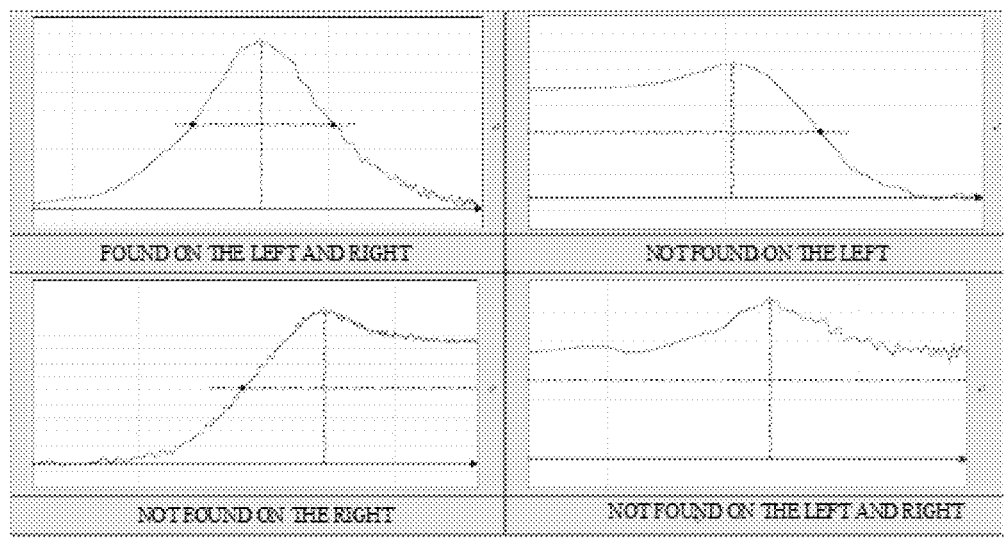
FIG. 5 is a schematic diagram of an absolute error frequency-response curve provided in other implementations of the present disclosure.

Thirdly, a preset frequency point can be set as the target frequency point when the target frequency point cannot be found by either the first way or the second way. The preset frequency points can specifically include a low frequency threshold (denoted as $f_{l\_thr}$) and a high frequency threshold (denoted as $f_{h\_thr}$). In an actual audio processing process, there may be a situation where the target frequency point can be found directly or indirectly as illustrated in a picture in an upper left corner of FIG. 5; or, there may be a situation where the frequency point corresponding to half of the maximum amplitude value cannot be found on the left as illustrated in a picture in an upper right corner of FIG. 5; or, there may be a situation where the frequency point corresponding to half of the maximum amplitude value cannot be found on the right as illustrated in a picture in a lower left corner of FIG. 5; or, there may be a situation where the frequency point corresponding to half of the maximum amplitude value cannot be found on both the right and left as illustrated in a picture in a lower right corner of FIG. 5. For the situation where the frequency point corresponding to half of the maximum amplitude value cannot be found on the left, the low-side frequency can be set as the low frequency threshold in the preset frequency point. For example, $f_l$ is set to be $f_{l\_thr}$. For the situation where the frequency point corresponding to half of the maximum amplitude value cannot be found on the right, the high-side frequency can be set as the high frequency threshold in the preset frequency point. For example, $f_h$ is set to be $f_{h\_thr}$. In an implementation, the low frequency threshold and the high frequency threshold are set according to empirical values.

After the target frequency point is obtained, the filter parameter can be determined by using the maximum amplitude value and the target frequency point. For example, the cut-off frequency is calculated through the target frequency point. Specifically, a product of the low-side frequency and the high-side frequency can be squared to obtain the cut-off frequency. For example, the cut-off frequency is $f_c = \sqrt{f_l * f_h}$. The quality factor Q can also be calculated through the cut-off frequency and the target frequency point, and $g_m^e$ is determined as the gain value. $g_m^e$ is the amplitude value of the error frequency-response curve $g_i^e$ at i=m.

After determining the filter parameter, the target filter set for matching the audio to-be-matched with the reference audio can be determined from the filter set to be selected by using the filter parameter. Specifically, the target filter set for matching the audio to-be-matched with the reference audio can be determined from the filter set to be selected by using the filter parameter as follows. N filters are determined from the M filters included in the filter set to be selected by using the filter parameter, N being a positive integer less than or equal to M; and an average absolute error value between a frequency-response curve of each of the N filters and the error frequency-response curve is obtained; and a first filter corresponding to a smallest average absolute error value among the N filters is added to the target filter set for matching the audio to-be-matched with the reference audio.

In order to screen out suitable filters, the N filters can be determined from the M filters included in the filter set to be selected by using the filter parameter as follows. The cut-off frequency in the filter parameter is compared with the preset frequency point to obtain a comparison result; and the N filters are determined from the M filters included in the filter set to be selected according to the comparison result. For example, $f_c$ and $f_{l\_thr}$ are compared, and when $f_c$ is less than or equal to $f_{l\_thr}$, N filters including low-pass filters can be determined from the M filters included in the filter set to be selected; and when $f_c$ is greater than or equal to $f_{h\_thr}$, N filters including high-pass filters are determined from the M filters included in the filter set to be selected.

In an implementation, the gain value $g_{ji}$ (j=1, . . . , N i=1, . . . , n) of each of the N filters at $f_i$ can be calculated according to the filter parameter, where N represents the number of the filters and n represents the number of frequency points. According to the calculated frequency-response curves $g_{ji}$ (j=1, . . . , N i=1, . . . , n) of these N filters, an average absolute error value between the frequency-response curve of each filter and the error frequency-response curve $g_i^e$ is calculated respectively. Assuming that the average absolute error value between the frequency-response curve of the j-th filter and the error frequency-response curve $g_i^e$ is $h_j$, $h_j$ can be calculated by a following equation:

$$h_j = \frac{1}{n}\sum_{i=1}^{n}|g_{ji} - g_i^e|. \qquad \text{equation 1.4}$$

The minimum average absolute error value is determined from the obtained N average absolute error values, and a sequence number of the minimum average absolute error value is set as $j_{min}$, where $j_{min}$=arg min($h_j$), and a filter corresponding to the minimum average absolute error value is determined as the first filter to be added to the target filter set.

In an implementation, in order to reduce a matching error between the audio to-be-matched and the reference audio, the error frequency-response curve can be updated for error judgment. Specifically, the error frequency-response curve is updated by using a frequency-response curve of the first filter to obtain an updated error frequency-response curve; the filter parameter is redetermined according to the updated error frequency-response curve on condition that an average absolute error value and a maximum absolute error value corresponding to the updated error frequency-response curve do not satisfy a preset condition; and a filter is added to the target filter set by using the redetermined filter parameter until the average absolute error value and the maximum absolute error value corresponding to the updated error frequency-response curve satisfy the preset condition. The preset condition includes that the average absolute error value is less than or equal to a first preset threshold and the maximum absolute error value is less than or equal to a second preset threshold. Satisfying the preset condition means that the matching error between the audio to-be-matched and the reference audio has tended to be stably convergent, and the target filter set at this time can be determined as the matching rule for the audio to-be-matched and the reference audio. For example, an equation for this preset condition is as follows:

$$\begin{cases} \text{aver\_value} < \text{aver\_value\_thr} \\ \text{max\_value} < \text{max\_value\_thr} \end{cases} \quad \text{equation 1.5}$$

where aver_value represents the average absolute error value corresponding to the updated error frequency-response curve, aver_value_thr represents the first preset threshold, and max_value represents the maximum average absolute error value corresponding to the updated error frequency-response curve, and max_value_thr represents the second preset threshold.

In an implementation, the error frequency-response curve is updated by using the frequency-response curve of the first filter to obtain an updated error frequency-response curve as follows. perform a difference operation between the error frequency-response curve and the frequency-response curve of the first filter to obtain the updated error frequency-response curve. For example, if the frequency-response curve of the first filter is $g_{ji}$, then the updated error frequency-response curve is $g_i^e = g_i^e g - g_{ji}$. When aver_value and max_value corresponding to the updated error frequency-response curve $g_i^e$ does not satisfy the preset condition, the filter parameter needs to be redetermined according to the updated error frequency-response curve $g_i^e$. A filter is added to the target filter set by using the redetermined filter parameter until aver_value and max_value corresponding to the updated error frequency-response curve $g_i^e$ satisfy equation 1.5.

At S306, an audio playing device is compensated by using the matching rule to adjust an audio playing effect of the audio playing device.

At S307, an audio is played through the compensated audio playing device.

A process of compensating the audio playing device by using the matching rule can be understood as a process of equalizing the audio played by the audio playing device by using the matching rule.

In an implementation, as can be seen from FIG. 3, the target filter set that simulates the equalizing process from the audio to-be-matched to the reference audio can be obtained through an equalization matching algorithm in the implementation of the present disclosure, and then the audio playing device is compensated by using the target filter set. The equalization matching algorithm can simulate an original equalizing process through existing filters.

In implementations of the disclosure, the terminal can obtain the matching rule for the audio to-be-matched and the reference audio, the matching rule being obtained according to the frequency spectrum difference between the audio to-be-matched and the reference audio; compensate the audio playing device by using the matching rule so as to adjust the audio playing effect of the audio playing device; and play the audio through the compensated audio playing device, thus effectively improving the adjustment efficiency of the audio playing effect and enabling the audio playing device to present a better audio playing effect.

Figure 6:
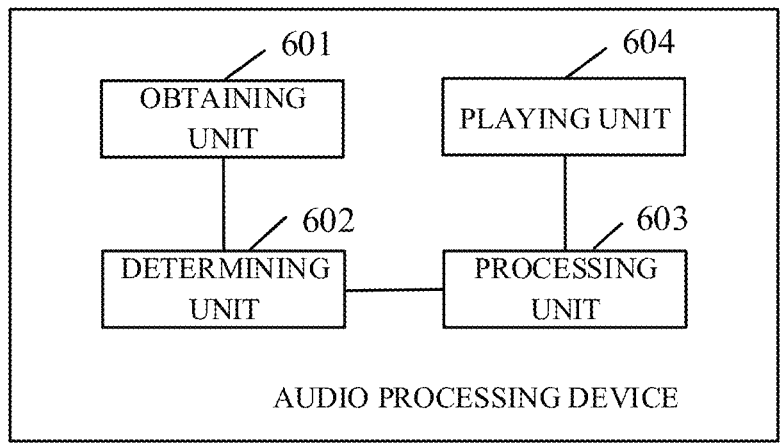
FIG. 6 is a schematic structural diagram of an audio processing device provided in implementations of the present disclosure.

Based on the description of the implementations of the audio processing method, an audio processing device is further provided in the implementations of the disclosure. Reference is made to FIG. 6, which is a schematic structural diagram of an audio processing device provided in implementations of the present disclosure. The device can be applied to the terminal. Specifically, the device can operate following units: an obtaining unit 601, a determining unit 602, a processing unit 603, and a playing unit 604.

The obtaining unit 601 is configured to obtain an audio to-be-matched and a reference audio and obtaining a frequency spectrum distribution of the audio to-be-matched and a frequency spectrum distribution of the reference audio.

The determining unit 602 is configured to determine a frequency spectrum difference between the audio to-be-matched and the reference audio according to the frequency spectrum distribution of the audio to-be-matched and the frequency spectrum distribution of the reference audio, determine, by using the frequency spectrum difference, a target filter set for matching the audio to-be-matched with the reference audio, and determine the target filter set as a matching rule for the audio to-be-matched and the reference audio.

The processing unit 603 is configured to compensate an audio playing device by using the matching rule to adjust an audio playing effect of the audio playing device.

The playing unit 604 is configured to play an audio through the compensated audio playing device.

In an implementation, the frequency spectrum difference is an error frequency-response curve between the audio to-be-matched and the reference audio, and the determining unit 602 configured to determine, by using the frequency spectrum difference, the target filter set for matching the audio to-be-matched with the reference audio specifically is configured to determine a filter parameter according to the error frequency-response curve; and determine, by using the filter parameter, the target filter set for matching the audio to-be-matched with the reference audio from a filter set to be selected. The filter set to be selected includes M filters, and M is a positive integer greater than or equal to 1.

In an implementation, the determining unit 602 configured to determine the filter parameter according to the error frequency-response curves specifically is configured to obtain a maximum amplitude value and a target frequency point on the error frequency-response curve, an amplitude value corresponding to the target frequency point being half of the maximum amplitude value, or the target frequency point being a preset frequency point; and determine the filter parameter by using the maximum amplitude value and the target frequency point. The filter parameter includes a cut-off frequency, a gain value, and a quality factor.

In an implementation, the determining unit 602 configured to determine, by using the filter parameter, the target filter set for matching the audio to-be-matched with the reference audio from the filter set to be selected specifically is configured to determine, by using the filter parameter, N filters from the M filters included in the filter set to be selected, N being a positive integer less than or equal to M; obtain an average absolute error value between a frequency-response curve of each of the N filters and the error frequency-response curve; and add a first filter corresponding to a smallest average absolute error value among the N filters to the target filter set for matching the audio to-be-matched with the reference audio.

In an implementation, the determining unit 602 is further configured to update the error frequency-response curve by using a frequency-response curve of the first filter to obtain an updated error frequency-response curve; redetermine a filter parameter according to the updated error frequency-response curve on condition that an average absolute error value and a maximum absolute error value corresponding to the updated error frequency-response curve do not satisfy a preset condition; and add a filter to the target filter set by using a redetermined filter parameter until the average absolute error value and the maximum absolute error value corresponding to the updated error frequency-response curve satisfy the preset condition. The preset condition includes that the average absolute error value is less than or equal to a first preset threshold and the maximum absolute error value is less than or equal to a second preset threshold.

According to the implementations of the present disclosure, operations at S301 to S307 involved in the audio processing method illustrated in FIG. 3 can be performed by respective units in the implementation of FIG. 6. For example, operations at S301 and S302 illustrated in FIG. 3 can be performed by the obtaining unit 601 illustrated in FIG. 6, operations at S303 to S305 can be performed by the determining unit 602 illustrated in FIG. 6, and operations at S306 and S307 can be performed by the processing unit 603 and the playing unit 604 respectively.

According to another implementation of the present disclosure, respective units in the audio processing device illustrated in FIG. 6 can be respectively or completely combined into one or several other units, or one (some) of the units can be further divided into several units which are smaller in terms of functions, which can realize the same operation without affecting realization of technical effects of the implementations of the present disclosure. The above units are divided in terms of logical functions. In practical applications, functions of one unit can also be realized by multiple units, or functions of multiple units can be realized by one unit. In other implementations of the present disclosure, the image processing device may also include other units. In practical applications, these functions may also be realized by other units, and may be realized by multiple units in cooperation.

According to another implementation of the present disclosure, the audio processing device as illustrated in FIG. 6 can be constructed and the audio processing method in the implementations of the present disclosure can be realized, by running a computer program (including program code) capable of executing respective operations involved in the audio processing method as illustrated in FIG. 3 on a general-purpose computing device such as a computer including processing elements and storage elements which may include a central processing unit (CPU), a random access storage medium (RAM), a read-only storage medium (ROM) or the like. The computer program can be recorded on, for example, a computer-readable recording medium, loaded in the above-mentioned computing device through the computer-readable recording medium, and executed thereon.

In implementations of the disclosure, the audio processing device can obtain the matching rule for the audio to-be-matched and the reference audio, the matching rule being obtained according to the frequency spectrum difference between the audio to-be-matched and the reference audio; compensate the audio playing device by using the matching rule so as to adjust the audio playing effect of the audio playing device; and play the audio through the compensated audio playing device, thus effectively improving the adjustment efficiency of the audio playing effect and enabling the audio playing device to present a better audio playing effect.

Figure 7:
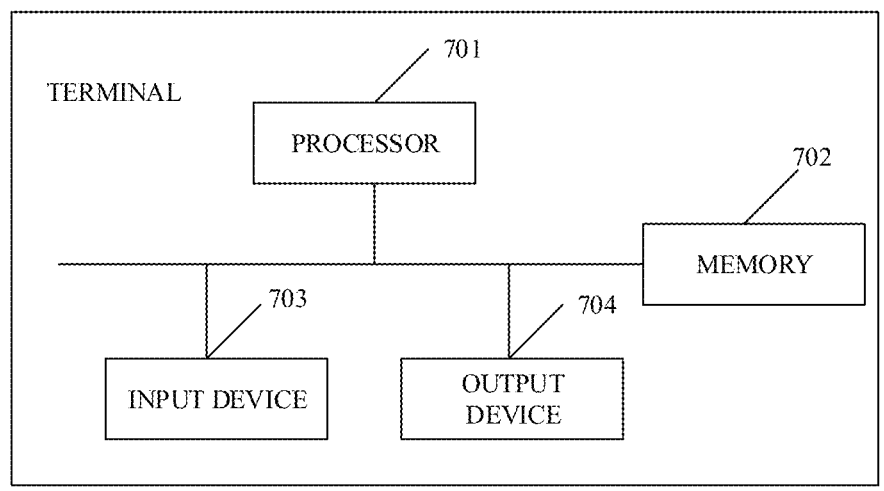
FIG. 7 is a schematic structural diagram of a terminal provided in implementations of the present disclosure.

Based on the audio processing method and the audio processing device illustrated in the above implementations, a terminal is further provided in an implementation of the disclosure. Referring to FIG. 7, an internal structure of the terminal at least includes at least one processor 701 and a memory 702. The processor 701 and the memory 702 in the terminal can be connected by a bus or in other ways. The bus connection is taken as an example in FIG. 7 in implementations of the present disclosure. Optionally, the internal structure of the terminal may further include at least one input device 703 and at least one output device 704. The processor 701, the memory 702, the input device 703, and the output device 704 are connected by the bus or in other ways, and the bus connection is taken as an example in FIG. 7 in implementations of the present disclosure. The memory 702 is configured to store computer programs including program instructions, and the processor 701 is configured to execute the program instructions stored in the memory 702. In an implementation of the present disclosure, one or more instructions stored in the computer-readable storage medium are loaded and executed by the processor 701 to realize respective operations of the method in respective implementations. Specifically, at least one instruction in the computer-readable storage medium is loaded by the processor 701 to perform following operations.

An audio to-be-matched and a reference audio are obtained. A frequency spectrum distribution of the audio to-be-matched and a frequency spectrum distribution of the reference audio are obtained. A frequency spectrum difference between the audio to-be-matched and the reference audio is determined according to the frequency spectrum distribution of the audio to-be-matched and the frequency spectrum distribution of the reference audio. A target filter set for matching the audio to-be-matched with the reference audio is determined by using the frequency spectrum difference. The target filter set is determined as the matching rule for the audio to-be-matched and the reference audio. An audio playing device is compensated by using the matching rule to adjust an audio playing effect of the audio playing device. An audio is played through the compensated audio playing device.

In an implementation, the frequency spectrum difference is the error frequency-response curve between the audio to-be-matched and the reference audio. Correspondingly, the at least one program instruction is loaded by the processor 701 and is further configured to execute following operations.

A filter parameter is determined according to the error frequency-response curve. The target filter set for matching the audio to-be-matched with the reference audio is determined from a filter set to be selected by using the filter parameter. The filter set to be selected includes M filters and M is a positive integer greater than or equal to 1.

In an implementation, the at least one program instruction is loaded by the processor 701 and is further configured to execute following operations.

A maximum amplitude value and a target frequency point on the error frequency-response curve are obtained, an amplitude value corresponding to the target frequency point is half of the maximum amplitude value, or the target frequency point is a preset frequency point. The filter parameter is determined by using the maximum amplitude value and the target frequency point, and the filter parameter includes a cut-off frequency, a gain value, and a quality factor.

In an implementation, the at least one program instruction is loaded by the processor 701 and is further configured to execute following operations.

N filters are determined by using the filter parameter from the M filters included in the filter set to be selected, N is a positive integer less than or equal to M. An average absolute error value between a frequency-response curve of each of the N filters and the error frequency-response curve is obtained. A first filter corresponding to a smallest average absolute error value among the N filters is added to the target filter set for matching the audio to-be-matched with the reference audio.

In an implementation, the at least one program instruction is loaded by the processor 701 and is further configured to execute following operations.

The cut-off frequency in the filter parameter is compared with the preset frequency point to obtain a comparison result. The N filters are determined from the M filters included in the filter set to be selected according to the comparison result.

In an implementation, the at least one program instruction is loaded by the processor 701 and is further configured to execute following operations.

The error frequency-response curve is updated by using a frequency-response curve of the first filter to obtain an updated error frequency-response curve. A filter parameter is redetermined according to the updated error frequency-response curve on condition that an average absolute error value and a maximum absolute error value corresponding to the updated error frequency-response curve do not satisfy a preset condition. A filter is added to the target filter set by using a redetermined filter parameter until the average absolute error value and the maximum absolute error value corresponding to the updated error frequency-response curve satisfy the preset condition, the preset condition includes that the average absolute error value is less than or equal to a first preset threshold and the maximum absolute error value is less than or equal to a second preset threshold.

In an implementation, the preset frequency points include a low frequency threshold and a high frequency threshold.

The processor 701 can be a central processing unit (CPU), and it can also be other general-purpose processors, namely microprocessors or any conventional processors. The memory 702 may include a read only memory (ROM) and a random access memory (RAM), and provides instructions and data to the processor 701. Therefore, the processor 701 and the memory 702 are not limited herein. The input device 703 may include an audio collecting device, such as a sound recorder, or may further include a touch screen. The output device 704 may include an audio playing device such as a speaker, or may further include a display screen. The touch screen and the display screen can be integrated into a touch display screen. Optionally, the input device 703 and the output device 704 may also include standard wired interfaces and/or wireless interfaces.

Specific operating processes of the terminal and the units described above can be referred to related descriptions in the previous implementations, which will not be repeatedly described herein. It can be understood by those skilled in the art that all or part of the processes in the above-mentioned methods can be completed by instructing related hardware through computer programs. The computer programs can be stored in a computer-readable storage medium, and when executed, involve processes of the above-mentioned methods. The storage medium can be a magnetic disk, an optical disk, a ROM, or a RAM.

The implementations disclosed above are only part of the implementations of the present disclosure, which of course cannot be constructed to limit the scope of the present disclosure. It can be understood by those skilled in the art that all or part of the processes for realizing the above implementations and equivalent changes made according to claims of the present disclosure still fall within the scope of the present disclosure.

What is claimed is:

1. An audio processing method, comprising:
obtaining an audio to-be-matched and a reference audio;
obtaining a frequency spectrum distribution of the audio to-be-matched and a frequency spectrum distribution of the reference audio;
determining a frequency spectrum difference between the audio to-be-matched and the reference audio according to the frequency spectrum distribution of the audio to-be-matched and the frequency spectrum distribution of the reference audio, wherein the frequency spectrum difference is an error frequency-response curve between the audio to-be-matched and the reference audio;
obtaining a maximum amplitude value and a target frequency point on the error frequency-response curve;
determining a filter parameter by using the maximum amplitude value and the target frequency point;
determining, by using the filter parameter, a target filter set for matching the audio to-be-matched with the reference audio from a filter set to be selected;
determining the target filter set as a matching rule for the audio to-be-matched and the reference audio;
compensating an audio playing device by using the matching rule to adjust an audio playing effect of the audio playing device; and
playing an audio through the compensated audio playing device;
wherein obtaining the target frequency point on the error frequency-response curve comprises one of:
in response to a first frequency point with half of the maximum amplitude value on the left and a second frequency point with the half of the maximum amplitude value on the right of a frequency point with the maximum amplitude value of the absolute error frequency-response curve being searched, determining the first frequency point and the second frequency point as the target frequency point;
in response to the first frequency point being searched and the second frequency point failing to be searched, determining the first frequency point and a high frequency threshold in a preset frequency point as the target frequency point;

in response to the first frequency point failing to be searched and the second frequency point being searched, determining the second frequency point and a low frequency threshold in the preset frequency point as the target frequency point; or in response to the first frequency point failing to be searched and the second frequency point failing to be searched, determining the low frequency threshold and the high frequency threshold in the preset frequency point as the target frequency point.

2. The method of claim 1, wherein the filter set to be selected comprises M filters and M being a positive integer greater than or equal to 1.

3. The method of claim 2, wherein the filter parameter comprises a cut-off frequency, a gain value, and a quality factor.

4. The method of claim 3, wherein determining, by using the filter parameter, the target filter set for matching the audio to-be-matched with the reference audio from the filter set to be selected comprises:

determining, by using the filter parameter, N filters from the M filters comprised in the filter set to be selected, N being a positive integer less than or equal to M;

obtaining an average absolute error value between a frequency-response curve of each of the N filters and the error frequency-response curve; and adding a first filter corresponding to a smallest average absolute error value among the N filters to the target filter set for matching the audio to-be-matched with the reference audio.

5. The method of claim 4, wherein determining, by using the filter parameter, the N filters from the M filters comprised in the filter set to be selected comprises:

comparing the cut-off frequency in the filter parameter with the preset frequency point to obtain a comparison result; and determining the N filters from the M filters comprised in the filter set to be selected according to the comparison result.

6. The method of claim 4, further comprising:

updating the error frequency-response curve by using a frequency-response curve of the first filter to obtain an updated error frequency-response curve;

redetermining a filter parameter according to the updated error frequency-response curve on condition that an average absolute error value and a maximum absolute error value corresponding to the updated error frequency-response curve do not satisfy a preset condition; and adding a filter to the target filter set by using the redetermined filter parameter until the average absolute error value and the maximum absolute error value corresponding to the updated error frequency-response curve satisfy the preset condition, the preset condition comprising that the average absolute error value is less than or equal to a first preset threshold and the maximum absolute error value is less than or equal to a second preset threshold.

7. The method of claim 6, wherein updating the error frequency-response curve by using the frequency-response curve of the first filter to obtain the updated error frequency-response curve comprises:

performing a difference operation between the error frequency-response curve and the frequency-response curve of the first filter to obtain the updated error frequency-response curve.

8. The method of claim 3, wherein the preset frequency point comprises a low frequency threshold and a high frequency threshold.

9. A terminal comprising a processor and a memory, wherein the processor and the memory are connected to each other, the memory is configured to store a computer program including program instructions, and the processor is configured to call the program instructions to:

obtain an audio to-be-matched and a reference audio;

obtain a frequency spectrum distribution of the audio to-be-matched and a frequency spectrum distribution of the reference audio;

determine a frequency spectrum difference between the audio to-be-matched and the reference audio according to the frequency spectrum distribution of the audio to-be-matched and the frequency spectrum distribution of the reference audio, wherein the frequency spectrum difference is an error frequency-response curve between the audio to-be-matched and the reference audio;

obtain a maximum amplitude value and a target frequency point on the error frequency-response curve;

determine a filter parameter by using the maximum amplitude value and the target frequency point;

determine, by using the filter parameter, a target filter set for matching the audio to-be-matched with the reference audio from a filter set to be selected;

determine the target filter set as a matching rule for the audio to-be-matched and the reference audio;

compensate an audio playing device by using the matching rule to adjust an audio playing effect of the audio playing device; and play an audio through the compensated audio playing device;

in terms of obtaining the target frequency point on the error frequency-response curve, the processor is configured to call the program instructions to:

in response to a first frequency point with half of the maximum amplitude value on the left and a second frequency point with the half of the maximum amplitude value on the right of a frequency point with the maximum amplitude value of the absolute error frequency-response curve being searched, determine the first frequency point and the second frequency point as the target frequency point;

in response to the first frequency point being searched and the second frequency point failing to be searched, determine the first frequency point and a high frequency threshold in a preset frequency point as the target frequency point;

in response to the first frequency point failing to be searched and the second frequency point being searched, determine the second frequency point and a low frequency threshold in the preset frequency point as the target frequency point; or in response to the first frequency point failing to be searched and the second frequency point failing to be searched, determine the low frequency threshold and the high frequency threshold in the preset frequency point as the target frequency point.

10. The terminal of claim 9, wherein the filter set to be selected comprises M filters and M being a positive integer greater than or equal to 1.

11. The terminal of claim 10, wherein the filter parameter comprises a cut-off frequency, a gain value, and a quality factor.

12. The terminal of claim 11, wherein in terms of determining, by using the filter parameter, the target filter set for matching the audio to-be-matched with the reference audio from the filter set to be selected, the processor is configured to call the program instructions to:
  determine, by using the filter parameter, N filters from the M filters comprised in the filter set to be selected, N being a positive integer less than or equal to M;
  obtain an average absolute error value between a frequency-response curve of each of the N filters and the error frequency-response curve; and
add a first filter corresponding to a smallest average absolute error value among the N filters to the target filter set for matching the audio to-be-matched with the reference audio.

13. The terminal of claim 12, wherein in terms of determining, by using the filter parameter, the N filters from the M filters comprised in the filter set to be selected, the processor is configured to call the program instructions to:
  compare the cut-off frequency in the filter parameter with the preset frequency point to obtain a comparison result; and
  determine the N filters from the M filters comprised in the filter set to be selected according to the comparison result.

14. The terminal of claim 12, the processor is further configured to call the program instructions to:
  update the error frequency-response curve by using a frequency-response curve of the first filter to obtain an updated error frequency-response curve;
  redetermine a filter parameter according to the updated error frequency-response curve on condition that an average absolute error value and a maximum absolute error value corresponding to the updated error frequency-response curve do not satisfy a preset condition; and
  add a filter to the target filter set by using the redetermined filter parameter until the average absolute error value and the maximum absolute error value corresponding to the updated error frequency-response curve satisfy the preset condition, the preset condition comprising that the average absolute error value is less than or equal to a first preset threshold and the maximum absolute error value is less than or equal to a second preset threshold.

15. The terminal of claim 14, wherein in terms of updating the error frequency-response curve by using the frequency-response curve of the first filter to obtain the updated error frequency-response curve, the processor is configured to call the program instructions to:
  perform a difference operation between the error frequency-response curve and the frequency-response curve of the first filter to obtain the updated error frequency-response curve.

16. The terminal of claim 11, wherein the preset frequency point comprises a low frequency threshold and a high frequency threshold.

17. A non-transitory computer-readable storage medium storing a computer program, wherein the computer program comprises program instructions that, when executed by a processor, cause the processor to:
  obtain an audio to-be-matched and a reference audio;
  obtain a frequency spectrum distribution of the audio to-be-matched and a frequency spectrum distribution of the reference audio;
  determine a frequency spectrum difference between the audio to-be-matched and the reference audio according to the frequency spectrum distribution of the audio to-be-matched and the frequency spectrum distribution of the reference audio, wherein the frequency spectrum difference is an error frequency-response curve between the audio to-be-matched and the reference audio;
  obtain a maximum amplitude value and a target frequency point on the error frequency-response curve;
  determine a filter parameter by using the maximum amplitude value and the target frequency point;
  determine, by using the filter parameter, a target filter set for matching the audio to-be-matched with the reference audio from a filter set to be selected;
  determine the target filter set as a matching rule for the audio to-be-matched and the reference audio;
  compensate an audio playing device by using the matching rule to adjust an audio playing effect of the audio playing device; and
  play an audio through the compensated audio playing device;
  in terms of obtaining the target frequency point on the error frequency-response curve, the program instructions, when executed by the processor, cause the processor to:
    in response to a first frequency point with half of the maximum amplitude value on the left and a second frequency point with the half of the maximum amplitude value on the right of a frequency point with the maximum amplitude value of the absolute error frequency-response curve being searched, determine the first frequency point and the second frequency point as the target frequency point;
    in response to the first frequency point being searched and the second frequency point failing to be searched, determine the first frequency point and a high frequency threshold in a preset frequency point as the target frequency point;
    in response to the first frequency point failing to be searched and the second frequency point being searched, determine the second frequency point and a low frequency threshold in the preset frequency point as the target frequency point; or
    in response to the first frequency point failing to be searched and the second frequency point failing to be searched, determine the low frequency threshold and the high frequency threshold in the preset frequency point as the target frequency point.

18. The non-transitory computer-readable storage medium of claim 17, wherein
  the filter set to be selected comprises M filters and M being a positive integer greater than or equal to 1.

19. The non-transitory computer-readable storage medium of claim 18, wherein
  the filter parameter comprises a cut-off frequency, a gain value, and a quality factor.

20. The non-transitory computer-readable storage medium of claim 18, wherein in terms of determining, by using the filter parameter, the target filter set for matching the audio to-be-matched with the reference audio from the filter set to be selected, the program instructions cause the processor to:
  determine, by using the filter parameter, N filters from the M filters comprised in the filter set to be selected, N being a positive integer less than or equal to M;
  obtain an average absolute error value between a frequency-response curve of each of the N filters and the error frequency-response curve; and add a first filter corresponding to a smallest average absolute error value among the N filters to the target filter set for matching the audio to-be-matched with the reference audio.

\* \* \* \* \*